US008866293B2

(12) United States Patent
Lin et al.

(10) Patent No.: US 8,866,293 B2
(45) Date of Patent: Oct. 21, 2014

(54) SEMICONDUCTOR STRUCTURE AND FABRICATION METHOD THEREOF

(75) Inventors: Yi-Hung Lin, Taichung (TW); Meng-Tsung Lee, Taichung (TW); Sui-An Kao, Taichung (TW); Yi-Hsin Chen, Taichung (TW); Feng-Lung Chien, Taiwan (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/167,086

(22) Filed: Jun. 23, 2011

(65) Prior Publication Data
US 2012/0280384 A1 Nov. 8, 2012

(30) Foreign Application Priority Data
May 5, 2011 (TW) .............................. 100115712 A

(51) Int. Cl.
*H01L 23/48* (2006.01)
*H01L 23/00* (2006.01)
*H01L 23/31* (2006.01)

(52) U.S. Cl.
CPC ........... *H01L 24/03* (2013.01); *H01L 2224/131* (2013.01); *H01L 2224/05022* (2013.01); *H01L 24/13* (2013.01); *H01L 2224/11462* (2013.01); *H01L 2224/05572* (2013.01); *H01L 2924/01029* (2013.01); *H01L 2224/0556* (2013.01); *H01L 2224/13082* (2013.01); *H01L 2224/03903* (2013.01); *H01L 2224/11849* (2013.01); *H01L 2224/039* (2013.01); *H01L 2224/119* (2013.01); *H01L 224/03912* (2013.01); *H01L 2224/13083* (2013.01); *H01L 2224/05027* (2013.01); *H01L 2224/0401* (2013.01); *H01L 23/3192* (2013.01); *H01L 2224/05166* (2013.01); *H01L 2224/13147* (2013.01); *H01L 2224/03901* (2013.01); *H01L 2224/13155* (2013.01); *H01L 24/05* (2013.01); *H01L 2224/0345* (2013.01); *H01L 24/11* (2013.01); *H01L 2224/0361* (2013.01); *H01L 2224/05647* (2013.01)
USPC .... 257/737; 257/738; 257/692; 257/E23.011; 438/613; 438/614

(58) Field of Classification Search
CPC .................................................. H01L 27/0886
USPC .......................... 257/737, 738, 692, E23.011; 438/613–614
See application file for complete search history.

(56) References Cited

U.S. PATENT DOCUMENTS

| 7,804,173 | B2 | 9/2010 | Ke et al. | |
| 7,863,740 | B2 | 1/2011 | Ke et al. | |
| 2008/0169562 | A1* | 7/2008 | Ke et al. | 257/737 |
| 2012/0248604 | A1* | 10/2012 | Daubenspeck et al. | 257/738 |

* cited by examiner

*Primary Examiner* — Mark A Laurenzi
(74) *Attorney, Agent, or Firm* — Edwards Wildman Palmer LLP; Peter F. Corless; Steven M. Jensen

(57) ABSTRACT

A semiconductor structure includes a semiconductor chip having at least an electrode pad, a first metal layer formed on the electrode pad, a second metal layer completely formed on and in contact with the first metal layer, and a conductive pillar disposed on the second metal layer, where a material of the first metal layer is different from a material of the second metal layer, the first metal layer has a first distribution-projected area larger than a second distribution projected-area of the conductive pillar, and the second metal layer has a third distribution-projected area that is the same as the second distribution-projected area of the conductive pillar.

7 Claims, 4 Drawing Sheets

SEMICONDUCTOR STRUCTURE AND FABRICATION METHOD THEREOF

CROSS-REFERENCES TO RELATED APPLICATIONS

This application claims under 35 U.S.C. §119(a) the benefit of Taiwanese Application No. 100115712, filed May 5, 2011, the entire contents of which is incorporated herein by reference.

BACKGROUND OF THE INVENTION

1. Field of the Invention

The present invention relates to semiconductor structures and fabrication methods thereof, and, more particularly, to a semiconductor structure having conductive pillars and a fabrication method thereof.

2. Description of Related Art

Electronic products are becoming lighter, thinner and smaller, as well as developed for high performance and multifunctionality. There are various types of semiconductor chip packages, such as wire bonding type packages, flip-chip type packages and so on. Compared with wire bonding type packages, flip-chip type packages are advantageous in reducing the overall volume of semiconductor devices.

A fabrication method of a flip-chip type package generally involves electrically connecting an active surface of a chip to conductive pads of a packaging substrate through a plurality of conductive bumps, and filling an underfill between the active surface of the semiconductor chip and the substrate for encapsulating the conductive bumps. Therein, the material of the conductive bumps greatly affects the flip-chip alignment accuracy.

U.S. Pat. Nos. 7,863,740 and 7,804,173 disclose methods for electrically connecting a semiconductor chip with a packaging substrate through copper pillars.

Referring to FIG. 1A, a semiconductor chip 10 having at least an electrode pad 100 is provided. The outer surface of the semiconductor chip 10 is made of a silicon nitride layer, which has an opening for exposing the electrode pad 100, respectively.

Then, a dielectric layer 12 is formed on the silicon nitride layer 101 and around the wall of the opening of the silicon nitride layer 101. Subsequently, a titanium layer 11 is formed to cover the entire surface of the dielectric layer 12 and the electrode pad 100. Further, a copper layer 13 is formed to cover the entire surface of the titanium layer 11.

Referring to FIG. 1B, a resist layer 14 is formed on the copper layer 13 and an open area 140 is formed in the resist layer 14 for exposing a portion of the copper layer 13. Then, a copper pillar 15 is formed on the exposed portion of the copper layer 13 and a solder material 16 is formed on a top surface of the copper pillar 15.

Referring to FIG. 1C, the resist layer 14 is removed to expose a portion of the copper layer 13.

Referring to FIG. 1D, using the copper pillar 15 as an etch stop layer, an etching process is performed to remove the exposed portion of the copper layer 13 and the titanium layer 11 under the exposed portion of the copper layer 13. Thereafter, a solder bump can be formed on the copper pillar 15 and the solder material 16, and then a reflow process can be performed so as to form a conductive bump electrically connecting the chip 10 and a packaging substrate (not shown).

Since the copper pillar 15 does not deform during the reflow process, melting and collapsing of the copper pillar 15 can be prevented, thereby avoiding position deviation of the chip 10 and increasing position alignment accuracy of the chip 10.

However, since the etching process using an etching solution is isotropic, when the copper layer 13 and the titanium layer 11 under the copper layer 13 are partially removed by etching, an undercut of the titanium layer 11 can occur, as shown at position K of FIG. 1D, thus resulting in an insufficient support for the copper pillar 15 and reducing the reliability of the conductive bump.

Therefore, there is a need to provide a semiconductor structure and a fabrication method thereof so as to overcome the above-described drawback.

SUMMARY OF THE INVENTION

Accordingly, the present invention provides a fabrication method of a semiconductor structure, which comprises the steps of: providing a chip having at least an electrode pad; forming a first metal layer on the electrode pad; forming a dielectric layer on the chip and the first metal layer, the dielectric layer having an opening for exposing a portion of the first metal layer; forming a second metal layer on the dielectric layer and the exposed portion of the first metal layer, the material of the first metal layer being different from that of the second metal layer; forming a conductive pillar on the second metal layer corresponding in position to the first metal layer; and removing a portion of the second metal layer that is not covered by the conductive pillar and preserving the remaining portion of the second metal layer covered by the conductive pillar.

The above-described method forms the first metal layer first and then forms the dielectric layer so as to define the size of the first metal layer before forming the second metal layer. Therefore, when the second metal layer is partially removed by etching, undercutting of the first metal layer can be avoided since the first metal layer is covered by the dielectric layer.

According to the above-described method, the present invention further provides a semiconductor structure, which comprises: a chip having at least an electrode pad; a first metal layer formed on the electrode pad; a dielectric layer formed on the chip and the first metal layer and having an opening for exposing a portion of the first metal layer; a second metal layer formed on the exposed portion of the first metal layer and the dielectric layer therearound, the material of the first metal layer being different from that of the second metal layer; and a conductive pillar disposed on the second metal layer.

In another aspect, the present invention provides a fabrication method of a semiconductor structure, which comprises: providing a chip having at least an electrode pad; forming a first metal layer on the electrode pad; forming a second metal layer on the first metal layer, the material of the first metal layer being different from that of the second metal layer; forming a conductive pillar on the second metal layer corresponding in position to the first metal layer, the first metal layer having an area larger than the sectional area of the conductive pillar; and removing a portion of the second metal layer that is not covered by the conductive pillar and preserving the remaining portion of the second metal layer covered by the conductive pillar.

When the second metal layer is partially removed by etching, since the area of the first metal layer is larger than the sectional area of the conductive pillar, undercutting of the first metal layer can be avoided. That is, instead of completely positioning the titanium layer under a copper pillar as in the prior art, a portion of the first metal layer is exposed from the conductive pillar even if the first metal layer experiences an isotropic etching process.

According to the above-described method, the present invention provides another semiconductor structure, which comprises: a chip having at least an electrode pad; a first metal layer formed on the electrode pad; a second metal layer formed on the first metal layer, the material of the first metal layer being different from that of the second metal layer; and a conductive pillar disposed on the second metal layer, the first metal layer having an area larger than the sectional area of the conductive pillar.

DETAILED DESCRIPTION OF PREFERRED EMBODIMENTS

The following illustrative embodiments are provided to illustrate the disclosure of the present invention and its advantages, these and other advantages and effects will be apparent to those in the art after reading this specification.

It should be noted that the drawings are not intended to limit the present invention. Various modification and variations can be made without departing from the spirit of the present invention. Further, terms such as "one", "above" and so on are merely for illustrative purpose and should not be construed to limit the scope of the present invention.

First Embodiment

FIGS. 2A to 2G are cross-sectional views showing a fabrication method of a semiconductor structure according to a first embodiment of the present invention.

Figure 1A:
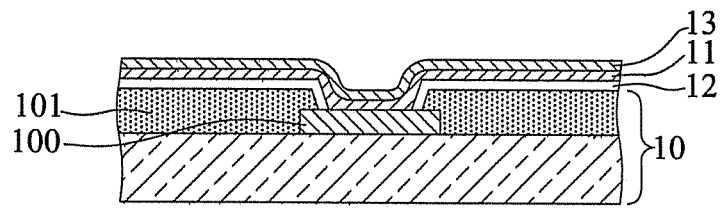
FIGS. 1A to 1D are cross-sectional views showing a fabrication method of a semiconductor structure in the prior art.
Figure 1B:
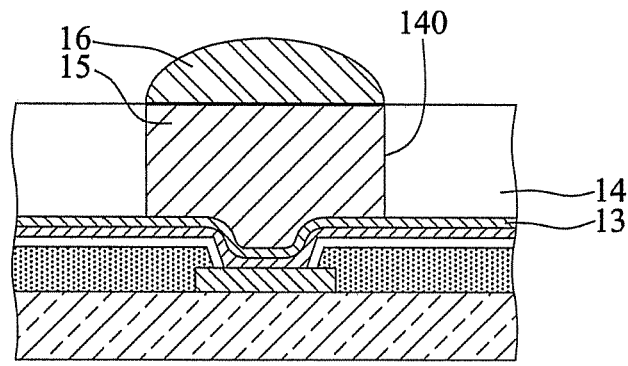
Figure 1C:
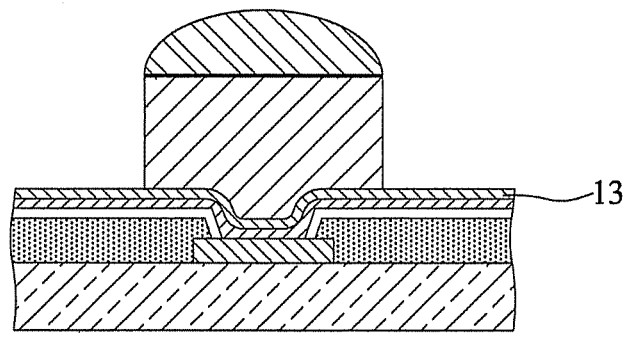
Figure 1D:
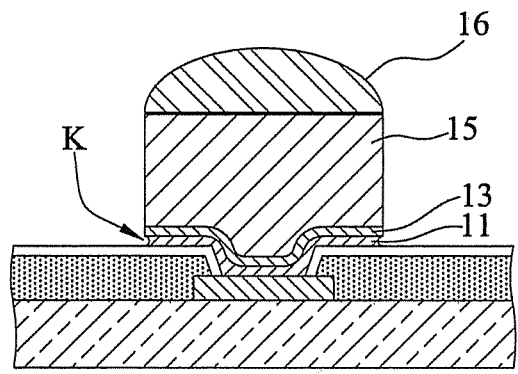
Figure 2A:
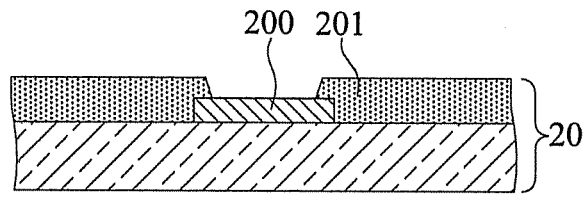
FIGS. 2A to 2G are cross-sectional views showing a fabrication method of a semiconductor structure according to a first embodiment of the present invention.

Referring to FIG. 2A, a semiconductor chip 20 having at least an electrode pad 200 made of, for example, aluminum is provided. The outer surface of the semiconductor chip 20 is made of, for example, a silicon nitride layer 201 and has an opening for exposing the electrode pad 200. There are various pertinent chip structures in the art and detailed description thereof is omitted herein for brevity.

Figure 2B:
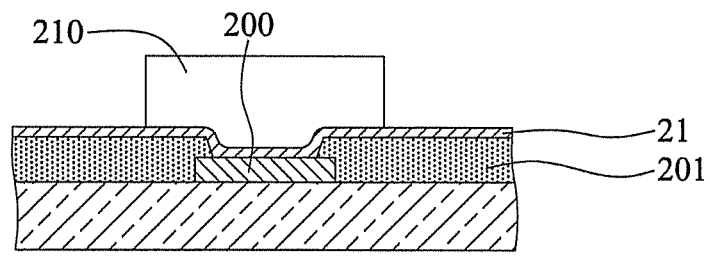
Figure 2B:
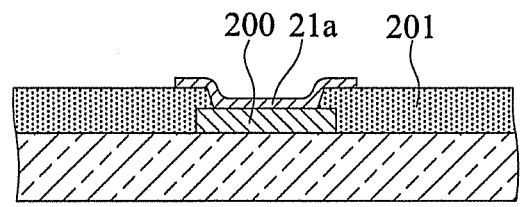

Referring to FIG. 2B(b), a first metal layer 21a, such as a titanium layer or a titanium tungsten layer, is formed on the electrode pad 200 and the silicon nitride layer 201 therearound.

In the present embodiment, the first metal layer is formed through a patterning process. First, as shown in FIG. 2B(a), a first metal material 21 is formed on the electrode pad 200 and the entire surface of the silicon nitride layer 201 by sputtering. Then, a resist layer 210 is formed to cover a portion of the first metal material 21 located on the electrode pad 200 and the silicon nitride layer 201 around the electrode pad 200. Referring to FIG. 2B(b), the remaining portion of the first metal material 21 that is not covered by the resist layer 210 is removed by etching and then the resist layer 210 is removed to obtain a first metal layer 21a. The resist layer 210 can be made of photoresist, and open areas of the resist layer 210 for partially exposing the first metal material 21 can be formed by exposure and development. It should be noted that various patterning processes in the art can be applied in the present invention and detailed description thereof is omitted herein.

Figure 2C:
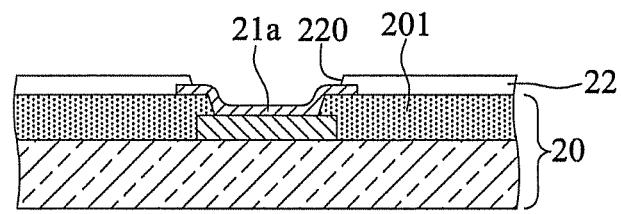

Referring to FIG. 2C, a dielectric layer 22 is formed on the silicon nitride layer 201 and the first metal layer 21a and an opening 220 is formed in the dielectric layer 22 for exposing a portion of the first metal layer 21a.

In the present embodiment, the dielectric layer 22 is a polyimide layer, but is not limited thereto.

Figure 2D:
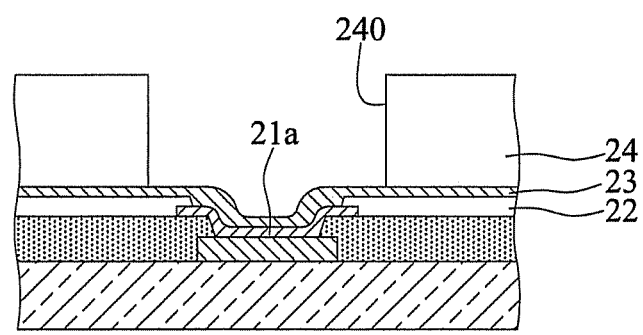

Referring to FIG. 2D, a second metal layer 23, such as a copper layer, is formed on the dielectric layer 22 and the exposed portion of the first metal layer 21a by sputtering.

Then, a resist layer 24 made of photoresist is formed on the second metal layer 23, and an open area 240 is formed in the resist layer 24 by exposure and development for exposing a portion of the second metal layer 23 corresponding in position to the first metal layer 21a. In the present embodiment, the open area 240 is larger than the area of the first metal layer 21a.

Figure 2E:
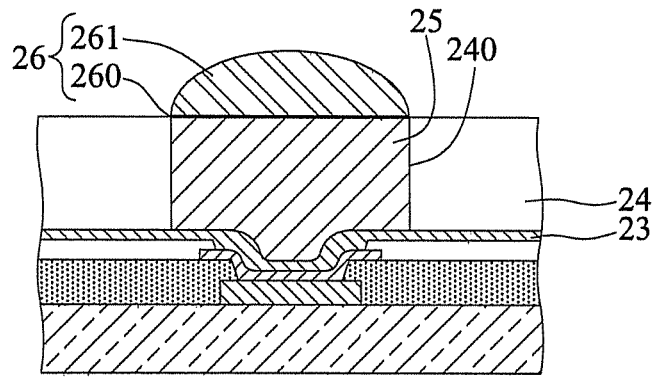

Referring to FIG. 2E, a conductive pillar 25 is formed on the second metal layer 23 in the open area 240 by electroplating. In the present embodiment, the conductive pillar 25 is a copper pillar.

Further, a conductive material 26 can be formed on a top surface of the conductive pillar 25. In the present embodiment, the conductive material 26 consists of a nickel material 260 and a solder material 261. In other embodiments, the conductive material 26 can be a solder material.

Figure 2F:
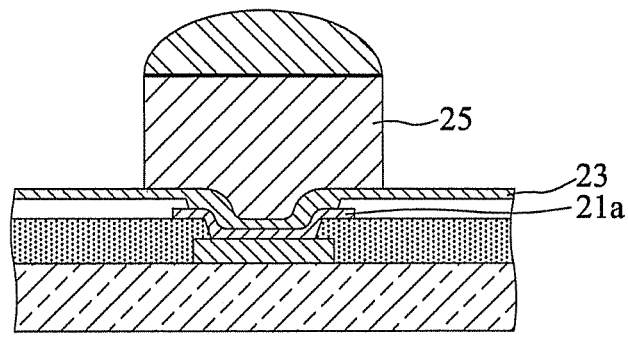

Referring to FIG. 2F, the resist layer 24 is removed to expose a portion of the second metal layer 23 that is not covered by the conductive pillar 25.

Figure 2G:
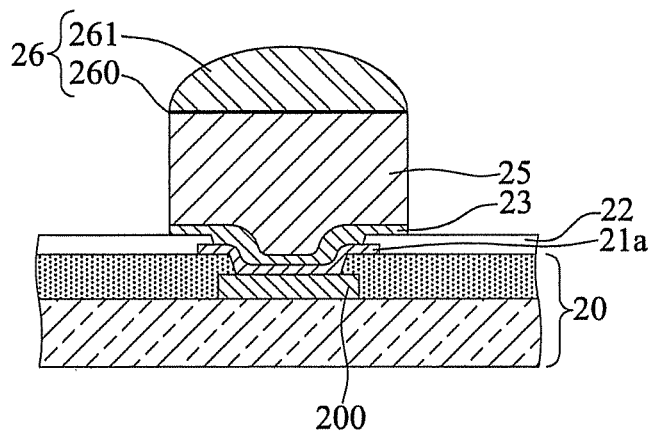

Referring to FIG. 2G, the exposed portion of the second metal layer 23 is removed by etching to expose the dielectric layer 22 around the conductive pillar 25. Meanwhile, the remaining portion of the second metal layer 23 that is covered by the conductive pillar 25 is preserved. Thus, a semiconductor structure is obtained. In subsequent processes, a solder bump can be formed on the conductive pillar 25 and the solder material 26 and then reflowed so as to form a conductive bump electrically connecting the semiconductor structure and a packaging substrate (not shown).

The semiconductor structure has a semiconductor chip 20 having at least an electrode pad 200, a first metal layer 21a formed on the electrode pad 200 and a surface of the chip 20 around the electrode pad 200, a first dielectric layer 22 formed on the chip 20 and the first metal layer 21 a and having an opening 220 for exposing a portion of the first metal layer 21a, a second metal layer 23 formed on the exposed portion of the first metal layer 21a and the dielectric layer 22 therearound, and a conductive pillar 25 disposed on the second metal layer 23. Therein, the material of the first metal layer 21a (for example, titanium) is different from the material of the second metal layer 23 (for example, copper). The semiconductor structure further has a conductive material 26 disposed on a top surface of the conductive pillar 25.

The present invention defines the size of the first metal layer 21a before forming the dielectric layer 22 and the second metal layer 23. When the exposed portion of the second metal layer 23 is removed by etching, undercutting of the first metal layer 21a can be avoided since the first metal layer 21a is covered by the dielectric layer 22, thereby providing sufficient support to the conductive pillar 25 and accordingly increasing the reliability of the subsequently formed conductive bump.

Second Embodiment

FIGS. 3A to 3D are cross-sectional views showing a fabrication method of a semiconductor structure according to a second embodiment of the present invention. Compared with the first embodiment, the dielectric layer and the first metal layer of the present embodiment are fabricated in a different sequence. Related processes are described as follows.

Figure 3A:
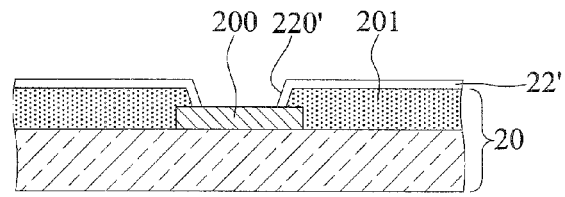
FIGS. 3A to 3D are cross-sectional views showing a fabrication method of a semiconductor structure according to a second embodiment of the present invention.

Referring to FIG. 3A, continuing from FIG. 2A, a dielectric layer 22' is formed on the silicon nitride layer 201 and the electrode pad 200 of the chip 20 and has an opening 220' for exposing the electrode pad 200.

Figure 3B:
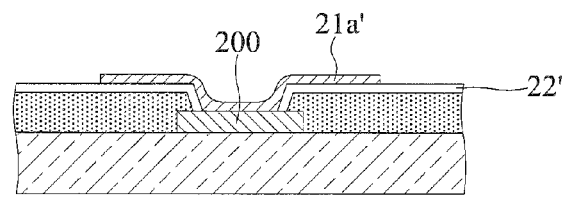

Referring to FIG. 3B, a first metal layer 21a' is formed on the electrode pad 200 and the dielectric layer 22' around the electrode pad 200 by patterning.

Figure 3C:
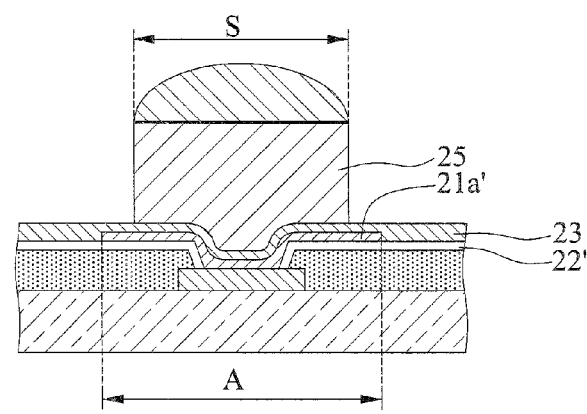

Referring to FIG. 3C, a second metal layer 23 is formed on the dielectric layer 22' and the first metal layer 21a.

Then, a conductive pillar 25 is formed on the second metal layer 23 corresponding in position to the first metal layer 21a' by patterning. The first metal layer 21a' has a first distribution-projected area A larger than the second distribution-projected area S of the conductive pillar 25.

Figure 3D:
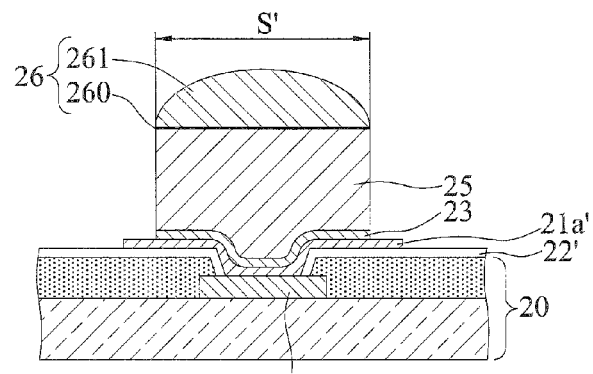

Referring to FIG. 3D, a portion of the second metal layer 23 that is not covered by the conductive pillar 25 is removed and the remaining portion of the second metal layer 23 covered by the conductive pillar 25 is preserved, thus obtaining a semiconductor structure. Subsequently, a conductive bump can be formed through a reflow process for electrically connecting the semiconductor structure and a packaging substrate. The second metal layer 23 has a third distribution-projected area S' that is the same as the second distribution-projected area S of the conductive pillar 25.

The semiconductor structure has a semiconductor chip 20 having at least an electrode pad 200, a dielectric layer 22 formed on the chip 20 and the electrode pad 200 and having an opening 220' for exposing the electrode pad 200, a first metal layer 21a' formed on the electrode pad 200 and the dielectric layer 22' around the electrode pad 200, a second metal layer 23 formed on the first metal layer 21a', and a conductive pillar 25 disposed on the second metal layer 23. Therein, the first metal layer 21a' has an area A larger than the sectional area S of the conductive pillar 25. The material of the first metal layer 21a' (for example, titanium) is different from the material of the second metal layer 23 (for example, copper). The semiconductor structure further has a conductive material 26 disposed on a top surface of the conductive pillar 25.

In the present embodiment, during etching of the second metal layer 23, since the first metal layer 21a' has an area A larger than the sectional area S of the conductive pillar 25, even if the first metal layer 21a' experiences isotropic etching, the first metal layer 21a' is still exposed on the dielectric layer 22', thereby avoiding an undercut as in the prior art so as to provide sufficient support for the conductive pillar 25 and increase the reliability of the conductive bump.

The above-described descriptions of the detailed embodiments are provided to illustrate the preferred implementation according to the present invention, not to limit the scope of the present invention. Accordingly, numerous modifications and variations completed by those with ordinary skill in the art will fall within the scope of present invention as defined by the appended claims.

What is claimed is:

1. A semiconductor structure, comprising:
a chip having at least an electrode pad;
a first metal layer formed on the electrode pad;
a second metal layer completely formed on and in contact with the first metal layer, the first metal layer being different in material from the second metal layer; and
a conductive pillar disposed on the second metal layer,
wherein the first metal layer has a first distribution-projected area larger than a second distribution-projected area of the conductive pillar, and the second metal layer has a third distribution-projected area that is the same as the second distribution-projected area of the conductive pillar, such that a top surface of the first metal layer is exposed from the conductive pillar and the second metal layer.

2. The structure of claim 1, wherein the first metal layer is a titanium layer or a titanium tungsten layer.

3. The structure of claim 1, further comprising a dielectric layer formed on the chip and the electrode pad and having an opening for exposing the electrode pad so as to allow the first metal layer to be formed thereon.

4. The structure of claim 3, wherein the first metal layer extends to a surface of the dielectric layer around the electrode pad.

5. The structure of claim 1, wherein the second metal layer is a copper layer.

6. The structure of claim 1, wherein the conductive pillar is a copper pillar.

7. The structure of claim 1, further comprising a conductive material formed on a top surface of the conductive pillar.

* * * * *